United States Patent
Athavale et al.

(10) Patent No.: US 6,518,118 B2
(45) Date of Patent: Feb. 11, 2003

(54) STRUCTURE AND PROCESS FOR BURIED BITLINE AND SINGLE SIDED BURIED CONDUCTOR FORMATION

(75) Inventors: Satish D. Athavale, Fishkill, NY (US); Ramachandra Divakaruni, Somers, NY (US); Jack A. Mandelman, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/808,799

(22) Filed: Mar. 15, 2001

(65) Prior Publication Data

US 2002/0130346 A1 Sep. 19, 2002

(51) Int. Cl.$^7$ ............................................ H01L 21/8242
(52) U.S. Cl. ........................ 438/243; 438/244; 438/386
(58) Field of Search ............................. 257/68, 301, 302; 438/243, 244, 245, 246, 248, 386, 387, 388, 389, 391

(56) References Cited

U.S. PATENT DOCUMENTS

| | | |
|---|---|---|
| 4,988,637 A | 1/1991 | Dhong et al. |
| 5,053,350 A * | 10/1991 | Solomon .................... 438/209 |
| 5,103,276 A | 4/1992 | Shen et al. |
| 5,244,824 A | 9/1993 | Sivan |
| 5,502,320 A | 3/1996 | Yamada |
| 5,512,767 A | 4/1996 | Noble, Jr. |
| 5,543,348 A | 8/1996 | Hammerl et al. |
| 5,641,694 A | 6/1997 | Kenney |
| 5,656,535 A | 8/1997 | Ho et al. |
| 5,670,805 A | 9/1997 | Hammerl et al. |
| 5,770,876 A | 6/1998 | Lam et al. |
| 5,780,335 A | 7/1998 | Henkels et al. |
| 5,792,685 A | 8/1998 | Hammerl et al. |
| 5,793,075 A | 8/1998 | Alsmeier et al. |
| 5,827,765 A | 10/1998 | Stengl et al. |
| 5,843,820 A | 12/1998 | Lu |
| 5,844,266 A | 12/1998 | Stengl et al. |
| 5,893,735 A | 4/1999 | Stengl et al. |
| 5,909,044 A | 6/1999 | Chakravarti et al. |
| 5,923,971 A | 7/1999 | Ho et al. |
| 5,945,704 A | 8/1999 | Schrems et al. |
| 5,945,707 A | 8/1999 | Bronner et al. |
| 5,949,700 A | 9/1999 | Furukawa et al. |
| 5,953,607 A | 9/1999 | Hakey et al. |
| 5,998,821 A | 12/1999 | Hieda et al. |
| 6,018,174 A | 1/2000 | Schrems et al. |
| 6,034,877 A | 3/2000 | Bronner et al. |
| 6,037,194 A | 3/2000 | Bronner et al. |
| 6,037,620 A | 3/2000 | Hoenigschmid et al. |
| 6,057,188 A | 5/2000 | El-Karch et al. |
| 6,063,657 A | 5/2000 | Bronner et al. |
| 6,063,658 A | 5/2000 | Horak et al. |
| 6,144,054 A * | 11/2000 | Agahi et al. .................. 257/296 |
| 6,291,286 B1 * | 9/2001 | Hsiao .......................... 438/238 |
| 6,348,374 B1 * | 2/2002 | Athavale et al. ............. 438/242 |

* cited by examiner

Primary Examiner—Olik Chaudhuri
Assistant Examiner—Hoai Pham
(74) Attorney, Agent, or Firm—Steven Capella

(57) ABSTRACT

Semiconductor devices generally, and in particular DRAM memory devices, having buried, single-sided conductors are provided. Additionally, methods of fabricating semiconductor devices having buried, single-sided conductors are provided.

8 Claims, 4 Drawing Sheets

X1-X1

X1-X1

X1–X1

X1–X1

STRUCTURE AND PROCESS FOR BURIED BITLINE AND SINGLE SIDED BURIED CONDUCTOR FORMATION

FIELD OF THE INVENTION

The invention relates to semiconductor devices, including DRAM memory devices. In particular, the invention relates to such devices having buried single-sided conductors and methods for their formation.

BACKGROUND OF THE INVENTION

Large DRAMs are silicon based. Each DRAM cell typically includes a single MOS field effect transistor, a charge transfer device, with one of its source/drain diffusions connected to a storage capacitor. The other of the source/drain diffusions of the MOSFET typically is connected to a bit line. The gate typically is connected to a word line.

The DRAM cell operates by storing a charge on the capacitor for a logic 1 and not storing any charge for a logic 0. To maintain stable circuit operation, the capacitance must be large enough and the charge transfer device must retain the stored charge, to yield a sufficient signal-to-noise ratio.

Continued miniaturization in the IC industry is driving a paradigm shift towards devices with vertical MOSFET access transistors. The long term trend in DRAM technology is toward storage elements with stacked capacitors (STC). These trends were described in the disclosure of application Ser. No. 09/597,887, filed Jun. 19, 2000 and assigned to the assignee of the present application. In order to successfully fabricate vertical MOSFET access transistors, robust methods of fabricating single sided conductor elements must be developed. The methods described in the prior art make use of photoresist materials to fill structures, photoresist CMP, lithography exposure to perform partial expose within a narrow topography region -techniques that are quite unproven, may not be well-controlled, and probably lack robustness for under 120 nanometers ground rule manufacturing for which they are intended. The present invention described herein improves upon the prior art and overcomes the problems encountered there. Further, the inventive method employed here does not make use of any additional lithography steps and it is inherently self-aligned, obviating any lithography alignment and overlay issues.

In the prior art, a double-sided strap is temporarily formed, allowing out-diffusion to occur on the side of the storage trench which should not contain a strap. This leads to the problem of undesirable interactions between adjacent devices. The present invention teaches a novel method of cutting the strap early in the process on one side only, thereby enabling controlled dopant out-diffusion from one side of the strap, while preventing any dopant out-diffusion from the other side of the strap.

Although the present invention is described in its current embodiment as being used in a DRAM cell, it is applicable to other integrated circuits where buried conductor elements with single-sided contact need to be fabricated. Further, the present invention also teaches a method to form sub-minimum feature size structures without any additional lithography steps (a maskless process or a self-aligned process).

SUMMARY OF INVENTION

According to the invention, there is provided a semiconductor device fabricated as a trench capacitor cell having first and second sides. One side of the trench is filled with dielectric thus defining the resultant device into conductive and non-conductive sides. The conductive side of the trench has formed within it a buried conductive layer, a single sided strap formed above the conductive layer, and gate oxide formed above the strap. The strap forms a first electrode and the substrate, Si, forms a second electrode.

According to another aspect of the invention, angled ion implantation is used to dope a protective layer of polysilicon above the trench thus defining portions of the trench sensitive and insensitive to subsequent etching steps. Thus subsequent etching and deposition may occur without requiring expensive and time consuming lithographic operations.

According to another aspect of the invention, a structure and process especially suitable for vertical MOSFETs and stacked storage capacitor elements.

According to another aspect the invention relates to a method of fabricating a trench capacitor cell having a single-sided buried conductor comprising:

providing a semiconductor substrate successively layered with pads of SiN, hardened oxide, and SiN and having a bitline trench pattern etched therein;

providing trench liner;

filling the trench with dielectric;

pulling back top SiN layer;

conformally layering polysilicon over top SiN layer;

performing angled boron implantation wherein the implantation divides the trench into first and second sides;

etching undoped polysilicon from above the first side of the trench;

etching oxide fill layer from the first side of the trench;

etching exposed the first SiN liner from the first side of the trench;

forming a BBL conductor layer in the first side of the trench;

etching exposed oxide liner from the first side of the trench;

etching exposed the second SiN liner from the first side of the trench;

etching exposed the first SiN liner from the first side of the trench;

growing gate oxide on exposed Si surfaces;

forming gate oxide layer; and forming dielectric layer.

Furthermore, the invention provides a novel method for defining sub-lithographic features.

An advantage according to an aspect of the invention is a means for accomplishing controlled, anisotropic out-diffusion of dopant from a strap. Additionally, means are provided for cutting a strap on only one of two sides.

Moreover, the invention provides a novel structure and method for connecting wiring structures (wordlines) to gate conductors.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BRIEF DESCRIPTION OF DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF A PREFERRED EMBODIMENT

The present invention relates to ICs in general and, more particularly, to trench capacitors. Such ICs include, for example, memory ICs such as random access memories (RAMs), dynamic RAMs (DRAMs), synchronous DRAMs (SDRAMs), static RAMs (SRAMs), and read only memories (ROMs) or other memory ICs. Other ICs include logic devices such as programmable logic arrays (PLAs), application specific ICs (ASICs), merged logic/memory ICs (embedded DRAMs) or any circuit devices.

Typically, a plurality of ICs are fabricated on a semiconductor substrate, such as a silicon wafer, in parallel. After processing, the wafer is diced in order to separate the ICs into a plurality of individual chips. The chips are then packaged into final products. For purposes of discussion, the invention is described in the context of forming a single cell. Also for purposes of discussion, the present invention is described in the context of a DRAM cell. However, the invention extends to formation of trench capacitors in general.

Reference is made to the figures to illustrate selected embodiments and preferred modes of carrying out the invention. It is to be understood that the invention is not hereby limited to those aspects depicted in the figures.

Figure 1:
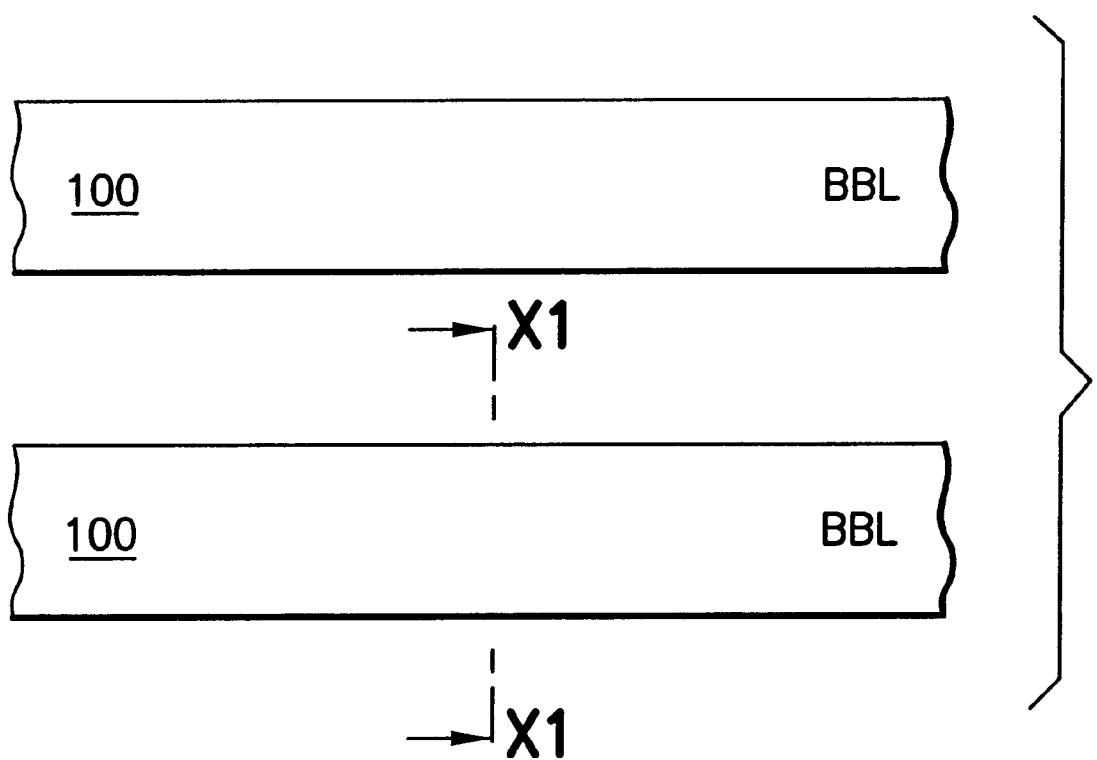
FIG. 1: top view showing BBL trenches.

Turning first to FIG. 1, a bitline trench pattern 100 is etched in the array area of the DRAM. The pattern is defined in the pad stack and is etched through the stack and into the substrate silicon for a depth of from about 30 to about 1000 nanometers.

Figure 2:
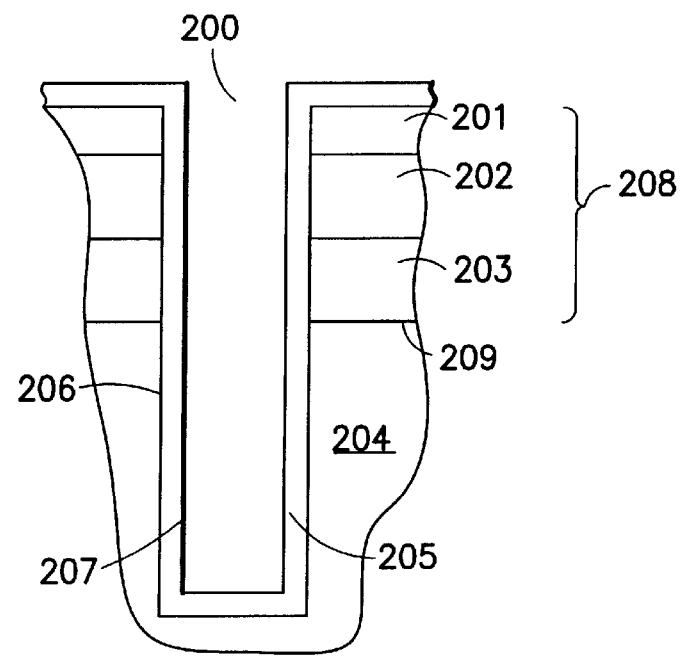
FIG. 2: is a transverse section through trench.

Referring to FIG. 2 which shows a transverse section of trench 200 etched through the pad stack 208; comprised of layers of pad oxide 209, in thickness of from about 30 to about 1000 nanometers; first pad nitride 203, in thickness of from about 20 to about 200 nanometers; hardened oxide 202, in thickness of from about 50 to about 300 nanometers; and second pad nitride 201; in thickness of from about 10 to about 300 nanometers; and into the silicon substrate 204. The trench is optionally lined with a thin SiN liner 206. A hardened oxide liner 205 is deposited and an optional thin SiN liner 207 is provided. Deposition of these films is performed using methods that are well known in the art such as by chemical vapor deposition (CVD). The range of thickness is from about 5 to about 50 nanometers, preferably about 20 nanometers.

Figure 3:
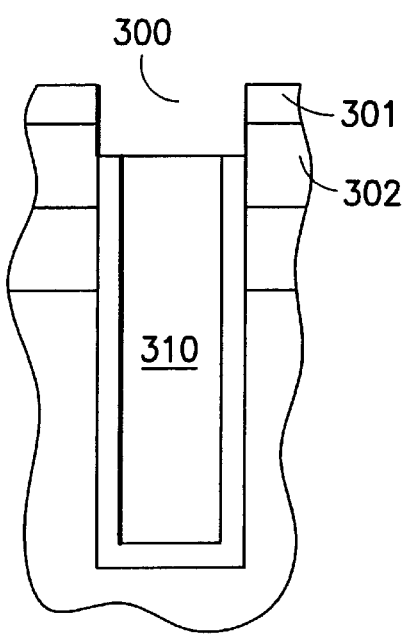
FIGS. 3–7 indicate processing steps in the fabrication of the structure.

Turning now to FIG. 3, the trench region 300 is filled with a dielectric 310, preferably HDP or similar oxide or a doped glass such as BSG or BPSG. The preparation and properties of these dielectrics are well known to the art. The wafer is planarized using for example CMP and the oxide fill is recessed to a depth at or below the interface between the top SiN 301 and the hardened oxide 302.

Figure 4:
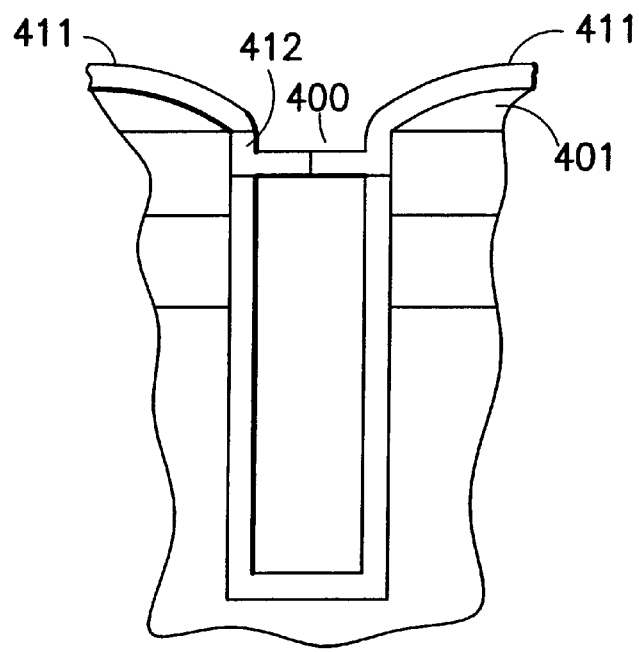

With reference to FIG. 4, the top SiN layer 401 is pulled back and thinned. Where SiN pull back refers to isotropic etching, using either wet or dry chemical techniques well known to the art. The remaining SiN layer 401 should be in the range of from about 10 to about 150 nanometers. A thin layer of intrinsic polysilicon 411, from about 5 to about 100 and preferably about 20 nanometers, is deposited conformally over the wafer surface. Angled boron implantation is conducted into the polysilicon 411. preferably, boron is injected at about 10 keV, at an angle of from about 30 to about 45 degrees with respect to normal, at a dose of about $1\times10^{13}$ ions $cm^2$ $BF_2^+$ resulting in an average doping concentration of about $1\times10^{17}$ to about $1\times10^{19}$ ions $cm^{-3}$. The polysilicon and SiN layers above hardened oxide, partially screen the ion beam, resulting in a non-doped area 412 of polysilicon, above the trench. The trench 400 is thus divided into first and second portions, respectively topped with implanted and unimplanted polysilicon.

Figure 5:
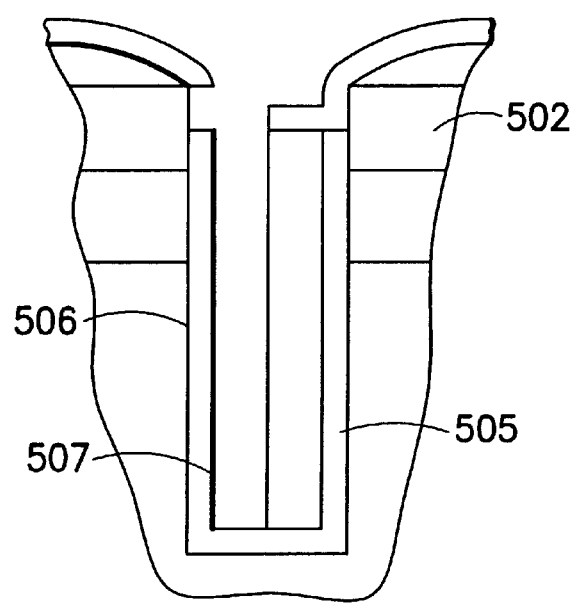

Turning to FIG. 5, the unimplanted polysilicon has been selectively etched by using, for example, an $NH_4OH$ solution. Subsequent etch and fill operations are self-aligned, masked by the doped poly cap. It is important to note that no lithographic steps are involved. The newly exposed oxide fill is removed from the second portion of the trench by RIE etch and the newly exposed SiN liner 507 from the second portion is removed selective to hardened oxide 502 by wet-etch.

Figure 6:
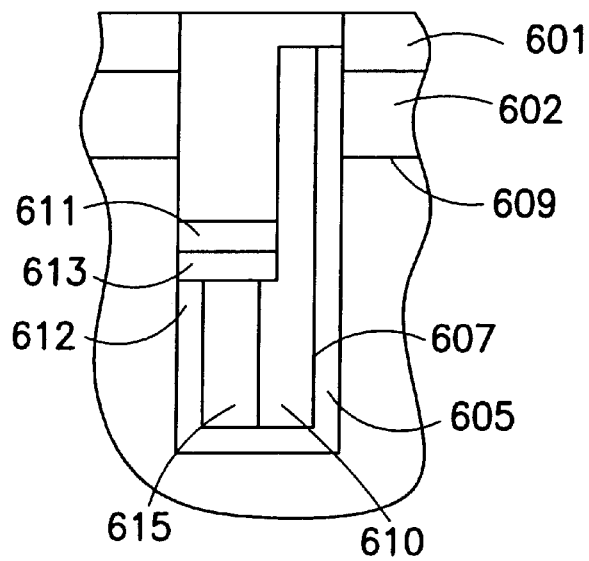

Turning now to FIG. 6, a layer of BBL conductor 615 is deposited, planarized to the level of the hardened oxide 601 and recessed to a depth of from about 200 to about 1000 and preferably about 500 nanometers. The BBL layer recess suitability depends on the conductance of the layer and the chip design requirements. The cross-sectional area (which is a function of the thickness [tallness] and recess of the BBL layer) are key factors determining the resistance of the BBL conductor. Suitable conductors for the buried bit line are W, Ti, TiN, and polysilicon doped with N+type atoms such as As or P to a concentration of at least $1\times10^{19}$ $cm^{-3}$. Exposed oxide liner 605 from the second portion of the trench is etched out by either a wet etch or CDE. This etch will tend to reduce the thickness of oxide 605 from the first side of the trench. The SiN liner 607 along the first side of the trench protects at least the thickness of liner 605. Preferably, more oxide is left. After the BBL layer 615 is recessed to the desired depth (which is a function of the conductivity or doping level of BBL layer) the top surface of the exposed oxide liner from the left edge of the trough is etched isotropically (using dilute HF wet etching or a isotropic dry etching method). This forms a dimple in the exposed oxide liner on the left side of the trough. The trough region is filled with polysilicon 613 and wafer is planarized to the top of the hardened oxide. Polysilicon 613 is recessed in the trough using well known dry etching techniques. A thin layer, about 3 nanometers in thickness and preferably from about 0.5 to about 10 nanometer, layer of TTO 614 is then grown (or deposited) using well known methods on top of polysilicon 613 using thermal oxidation.

Figure 7:
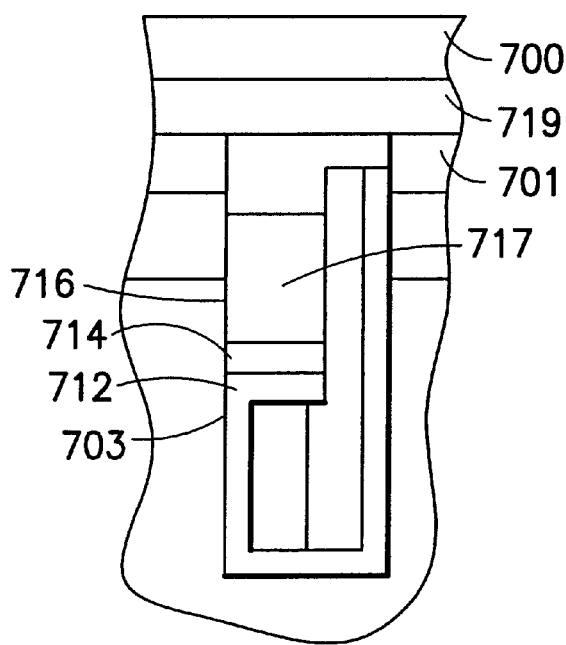

Reference is now made to FIG. 7 showing exposed SiN liner 706 etched to the top of the TTO 714. Gate oxide 716 is grown on the exposed Si surface, preferably, to a thickness of about 3 nanometers, but the thickness may vary from about 0.5 to about 10 nanometers. Note that according to an aspect of the invention, the strap polysilicon 713 is only formed on the second side of the trench, thus out-diffusion of dopant is prevented on the first side of the trench. Gate conductor 717 is deposited, planarized and recessed. The required recess depends on the design, conductance. The suitable recess for gate conductor 717 depends on the conductance of the layer and the chip design requirements. The cross-sectional area and recess of the Gate conductor layer are key factors determining the resistance of this structure. The design of the present embodiment requires about 50–400 nm of GC thickness. Gate conductor 717 comprises materials well known in the art such as intrinsic or doped polysilicon, W/WSi$_x$, or W/WN. Dielectric oxide 718 is deposited and planarized back to the level of hardened oxide 701. The structure is finished by deposition of blanket layers of SiN 719 and BSG 720.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for formation of a trench capacitor cell having a single-sided buried conductor comprising:

providing a semiconductor substrate successively layered with first pad SiN, hardened oxide, and second pad SiN and having a trench etched therein;

providing trench liner about an interior wall of said trench, said liner comprising a first SiN liner, an oxide liner and a second SiN liner, said second SiN liner being outermost relative to said first SiN liner and said oxide liner being between said first and second SiN liners;

filling the trench with trench dielectric;

pulling back said second pad SiN;

conformally layering polysilicon over said second pad SiN;

performing angled boron implantation into a portion of said conformal polysilicon on one side of said trench, wherein the implantation divides said trench into first and second sides;

etching undoped polysilicon from above said first side of said trench;

etching said dielectric from said first side of said trench to expose said first SiN liner;

etching exposed first SiN liner from said first side of said trench;

forming and recessing a buried bitline conductor layer in said first side of said trench;

etching further exposed oxide liner and first SiN liner from said first side of said trench to form space for a polysilicon strap;

forming a polysilicon strap in said space;

forming trench top oxide over said polysilicon strap;

etching exposed said second SiN liner from said first side of said trench to expose semiconductor surface;

growing gate oxide on exposed semiconductor surface;

forming gate conductor layer adjacent to said gate oxide;

forming a dielectric layer over said gate conductor;

depositing a blanket of SiN over said dielectric layer; and depositing a blanket of BSG.

2. A method for formation of a trench capacitor cell having a single-sided buried conductor, according to claim 1, wherein filling said trench comprises:

filling said trench with trench dielectric;

planarizing said trench;

recessing said oxide to a depth at or below the interface between said second layer of SiN and the hardened oxide.

3. A method for formation of a trench capacitor cell having a single-sided buried conductor, according to claim 1 wherein said trench dielectric is selected from the group consisting of HDP oxide, BSG, BPSG, or other suitable dielectric.

4. A method for formation of a trench capacitor cell having a single-sided buried conductor, according to claim 1, wherein forming a buried bitline conductor layer comprises:

depositing a layer of buried bitline conductor;

planarizing said buried bitline layer to height of said hardened oxide layer; and recessing said buried bitline layer.

5. A method for formation of a trench capacitor cell having a single-sided buried conductor, according to claim 1, wherein said buried bitline conductor is selected from the group consisting of Ti, TiN, polysilicon and doped polysilicon.

6. A method for formation of a trench capacitor cell having a single-sided buried conductor, according to claim 1, wherein forming gate conductor comprises:

depositing a layer of gate conductor material;

planarizing said gate conductor layer to lower surface of said hardened oxide layer; and recessing said gate conductor layer.

7. A method for formation of a trench capacitor cell having a single-sided buried conductor, according to claim 1, wherein said gate conductor material comprises conductive substances selected from the group consisting of intrinsic or doped polysilicon, W/WSi$_x$, and W/WN.

8. A method for formation of a trench capacitor cell having a single-sided buried conductor, according to claim 1, wherein forming dielectric layer comprises:

layer depositing a layer of dielectric oxide;

planarizing said dielectric oxide layer to top of said hardened oxide layer; and recessing said gate oxide layer.

* * * * *